(12) United States Patent
Cuvillier et al.

(10) Patent No.: US 12,542,388 B2
(45) Date of Patent: Feb. 3, 2026

(54) MOLDED ELECTRONIC DEVICE AND METHOD FOR MANUFACTURING SAME

(71) Applicant: FAURECIA INTERIEUR INDUSTRIE, Nanterre (FR)

(72) Inventors: Christophe Cuvillier, Saint Ouen l'Aumone (FR); Armand Brousselle, Paris (FR); Sebastien Trillat, Poissy (FR); Jean-Jacques Pesce, Bresles (FR)

(73) Assignee: FAURECIA INTERIEUR INDUSTRIE, Nanterre (FR)

( * ) Notice: Subject to any disclaimer, the term of this patent is extended or adjusted under 35 U.S.C. 154(b) by 321 days.

(21) Appl. No.: 18/472,861

(22) Filed: Sep. 22, 2023

(65) Prior Publication Data

US 2024/0106146 A1 Mar. 28, 2024

(30) Foreign Application Priority Data

Sep. 22, 2022 (FR) ...................................... 22 09617

(51) Int. Cl.
*H01R 12/79* (2011.01)
*H01R 13/50* (2006.01)
*H01R 43/18* (2006.01)

(52) U.S. Cl.
CPC ............. *H01R 12/79* (2013.01); *H01R 13/50* (2013.01); *H01R 43/18* (2013.01)

(58) Field of Classification Search
CPC ......... H01R 12/79; H01R 13/50; H01R 43/18
USPC .......................................................... 439/67
See application file for complete search history.

(56) References Cited

U.S. PATENT DOCUMENTS

| 5,519,201 | A | 5/1996 | Templeton, Jr. et al. |
| 5,757,622 | A | 5/1998 | Tanaka et al. |
| 7,544,898 | B2 * | 6/2009 | Hirano ..................... G06F 3/047 |
| | | | 361/803 |
| 8,912,447 | B2 * | 12/2014 | Leong ................ H03K 17/9622 |
| | | | 174/254 |
| 10,057,989 | B1 * | 8/2018 | Heikkinen ........... H05K 1/0284 |
| 2004/0074671 | A1 | 4/2004 | Hirano et al. |
| 2007/0069418 | A1 | 3/2007 | Lia et al. |
| 2014/0036428 | A1 | 2/2014 | Leong et al. |
| 2018/0359860 | A1 * | 12/2018 | Heikkinen ........... H05K 1/0284 |

FOREIGN PATENT DOCUMENTS

| CN | 110324973 A | 10/2019 |
| CN | 111399702 A | 7/2020 |
| EP | 1928639 A2 | 6/2008 |
| EP | 2758238 A1 | 7/2014 |
| FR | 3122781 A3 | 11/2022 |
| WO | 2018189419 A2 | 10/2018 |

OTHER PUBLICATIONS

French Search Report corresponding to application FR2209617, dated May 12, 2023, 10 pages.
Dupont, "Functional Ink Systems for "In Mold Electronics" The Next Generation Human-Machine Interfaces", 2019, pp. 1-23.

* cited by examiner

*Primary Examiner* — Gary F Paumen
(74) *Attorney, Agent, or Firm* — Reising Ethington P.C.

(57) ABSTRACT

A molded electronic device having a flexible film and electrical connection tracks arranged on the film and configured to be connected to conductive elements of a flexible connector, made of elastomer. The device includes a connector support molded onto the film and electrical connection tracks in order to form walls adapted to hold the connector.

12 Claims, 4 Drawing Sheets

MOLDED ELECTRONIC DEVICE AND METHOD FOR MANUFACTURING SAME

TECHNICAL FIELD

The present invention relates to a molded electronic device, in particular an electronic device produced using so-called "In-Mold Electronic" (IME) technology.

BACKGROUND

More particularly, in this technique, an electrical connection must be provided between an electronic control circuit and a film on which electrical connection tracks are formed and on which electronic components connected by said electrical connection tracks are placed. The electrical connection tracks are for example formed by depositing electrically conductive ink, for example by printing. This technology may for example be used in vehicle equipment, for example automotive equipment. For example, this technique can be used in a display device for a vehicle, where light sources used to illuminate pictograms of the display device are arranged on the flexible film and are powered by an electronic control circuit on a printed circuit board.

A connector connects the printed circuit board and the connection tracks formed on the film in order to ensure the supply and control of the electronic components. For this, the electrical connection tracks have connection pads at the location of the connector. In the connection pads, each electrical connection track is optionally widened to facilitate the electrical contact and to ensure a reliable electrical contact with an electrical element of the connector despite possible variations and tolerances on the positions and dimensions of the various elements.

SUMMARY

The purpose of the present invention is to improve molded electronic devices, and in particular to improve the connection with an external control electronic circuit.

To this end, the molded electronic device comprises:
a film, and
electrical connection tracks arranged on the film, the electrical connection tracks comprising connection pads configured to be connected to conductive elements of a connector, the electrical connection tracks extending partially in a longitudinal direction, and said connector being an elastic connector.

Furthermore, the molded electronic device comprises a connector support molded onto the film and on the electrical connection tracks to form walls adapted to hold the connector above the connection pads and between said walls.

By virtue of these arrangements, the connector support is adapted to a flexible elastomer connector by being directly overmolded onto the printed flexible film of the electrical connection tracks. This integration of the connector support by overmolding is less expensive and more compact than the current connection solutions.

In various embodiments of the molded electronic device according to the invention, any of the following arrangements may also be employed.

According to one aspect, the connector support has first portions located above the electrical connection tracks, said first portions or a first layer of the first portions having a first thickness of between 0.5 mm and 2.5 mm.

According to one aspect, the first thickness is less than 1.5 mm.

According to one aspect, the connector support comprises first portions located above the electrical connection tracks, said first portions or a first layer of the first portions having a first thickness decreasing moving away in the longitudinal direction from the connection pads According to one aspect, the walls of the connector support surround the connection pads.

According to one aspect, the connector support is formed by:
a first layer molded onto the electrical connection tracks, said first layer having a first thickness of between 0.5 mm and 2.5 mm, and said first layer forming a first part of the walls, and
a second layer molded onto the first layer and forming a second part of the walls.

According to one aspect, the second part of the walls is in the extension of the first part of the walls, for at least the walls substantially perpendicular to the longitudinal direction.

According to one aspect, the first layer has a first thickness that decreases moving away from the connection pads in the longitudinal direction.

According to one aspect, the connector support comprises:
first portions located above the electrical connection tracks, said first portions having a first thickness,
second portions not located above the electrical connection tracks, said second portions having a second thickness,
wherein the second thickness is at least two times greater than the first thickness.

According to one aspect, the walls of the first portions are further away from the connection pads than the walls of the second portions.

The present invention also relates to a method for manufacturing a molded electronic device comprising the steps of:
providing a film,
forming electrical connection tracks arranged on the film, the electrical connection tracks comprising connection pads configured to be connected to conductive elements of a connector, the electrical connection tracks extending partially in a longitudinal direction, and said connector being an elastic connector, and
forming a connector support by molding onto the film and onto the electrical connection tracks to form walls adapted to hold the connector above the connection pads and between said walls.

In various embodiments of the method of manufacturing the electronic device according to the invention, any of the following arrangements may also be employed:

According to one aspect, the connector support has first portions located above the electrical connection tracks, said first portions or a first layer of the first portions having a first thickness of between 0.5 mm and 2.5 mm.

According to one aspect, the connector support is produced by:
forming a first layer by molding onto the electrical connection tracks, said first layer having a first thickness of between 0.5 mm and 2.5 mm, and said first layer forming a first part of the walls, and
forming a second layer by molding onto the first layer and forming a second part of the walls,
said second layer being formed on the first layer after cooling of the first layer.

According to one aspect, the molding(s) are injection moldings.

BRIEF DESCRIPTION OF THE DRAWINGS

Other features and advantages will become apparent in the following description of embodiments, illustrated by way of non-limiting examples, with reference to the appended drawings, in which.

In the various figures, the same numerical references designate identical or similar elements.

DETAILED DESCRIPTION

Figure 1:
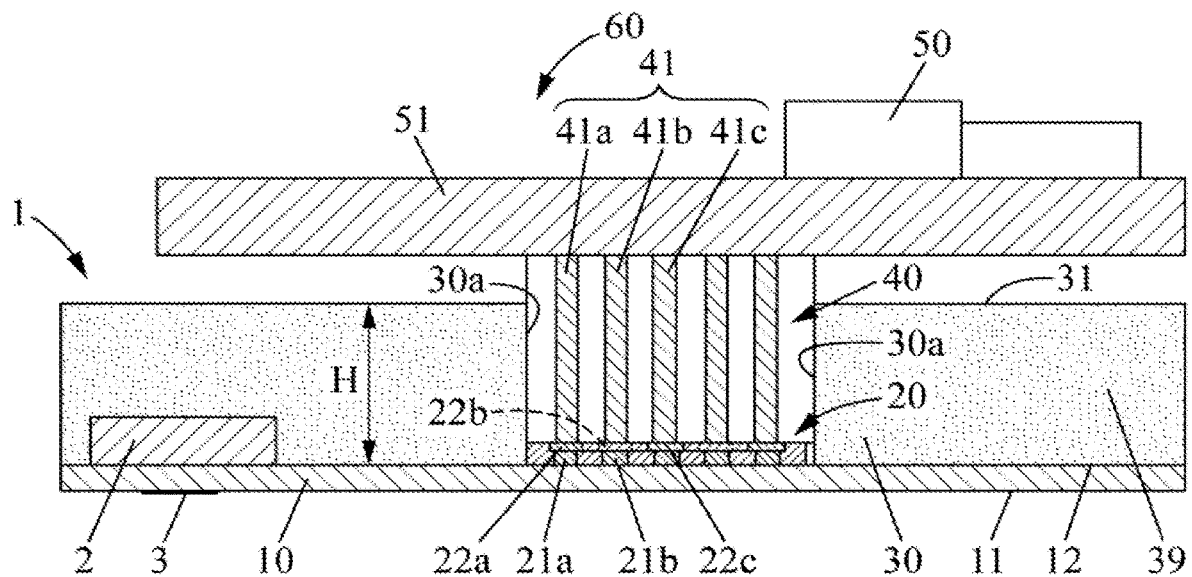
FIG. 1 is a schematic view of a display device comprising an electronic molded device according to the invention.

FIG. 1 shows an example of an application, simply for illustrative purposes, of a molded electronic device 1 according to the present disclosure. The molded electronic device 1 is for example a vehicle interior device, for example an automobile In this example of FIG. 1, a display device 60 of a vehicle makes it possible to inform a user for example about the operation of equipment of the vehicle, such as air conditioning, or parking brake.

The display device 60 comprises:
- a molded electronic device 1 including an electrical connection device 20 and a connector support 30,
- a connector 40, and
- an electronic control circuit 50.

The electronic control circuit 50 comprises a printed circuit board 51 on which the various electronic components and circuits are arranged. The electrical connection device 20 comprises connection pads 22. The connection device 20 may comprise any number of connection pads 22. Each connection pad 22 (22a, 22b, 22c, etc.) is in electrical contact with a conductive connection element of the electronic control circuit 50 or a connector 40.

The display device 60 comprises for example a light source 2. The electrical connection between the printed circuit board 51 of the electronic control circuit 50 and the light source 2 is produced by means of a connector 40 and the electrical connection device 20. For this, the conductive connecting elements 41 (for example, a series of conductive elements 41a, 41b, 41c, etc.) of the connector 40 are in contact with the connection pads 22 (for example, a series of connection pads 22a, 22b, 22c, etc.) of the connection device 20. The light source 2 is for example a light-emitting diode (LED).

The display device 60 considered here comprises a film 10, for example of the flexible type, on which a pictogram 3 is drawn. The film 10 constitutes a visible surface of the display device 60. The film 10 comprises a so-called exterior face 11, which is the surface facing the user and which is accessible to the user. The film 10 comprises a so-called interior face 12, opposite the exterior face 11. The interior face 12 is turned toward the bottom of the display device and is not accessible to the user. The pictogram 3 is, in the example of FIG. 1, printed on the exterior face 11 of the film 10. According to one embodiment not shown, the pictogram can also be printed on the interior face 12 of the film 10. The light source 2 is arranged on the film 10, and is electrically connected by electrical connection tracks 21 formed on the film 10. The electrical connection tracks 21 are for example produced by printing an electrically conductive ink on the film 10. The electrically conductive ink is for example based on copper or silver These electrical connection tracks 21 are connected to the control circuit 50 via conductive connection elements 41 of the connector 40. The electrical connection tracks 21 are arranged on the interior face 12 of the film 10. The light source 2 is arranged on the interior face 12 of the film 10. The electrical connection tracks 21 are arranged on the interior face 12 of the film 10.

A light guide can be arranged so as to transmit the light emitted by the light source 2 to the pictogram 3. According to one embodiment, this light guide is overmolded onto a part of the film 1 comprising the light source 2

A support material 39 is arranged on the interior face 12 of the film 10. According to one embodiment, the support material 39 is overmolded onto a part of the interior face 12 of the film 10. The support material 39 makes it possible to stiffen the film 10 in order to form the molded electronic device 1.

The support material 39 may be an opaque material. For example, it is arranged around the light guide.

The support material 39 is arranged to form a connector support 30 adapted to leave the connection pads 22 free and to leave a passage for the connector 40 free.

According to one embodiment, the display device 60 and/or the molded electronic device 1 comprises other electronic components.

The molded electronic device 1 according to the present disclosure, comprises:
- the film 10, and
- at least one electrical connection track 21 arranged on the film, the electrical connection track 21 comprising a connection pad 22 configured to be connected to a conductive element of a connector 40, the electrical connection track 21 extending partially in a longitudinal direction D1, for example in the connection pad 22, and said connector being an elastic connector.

Advantageously, the molded electronic device 1 comprises at least two electrical connection tracks 21 of the same type as the track described above. For example, the at least two electrical connection tracks 21 are parallel to one another. Usually, the molded electronic device 1 comprises electrical connection tracks 21, that is, a plurality of electronic connection tracks. By simplifying the description and by consistency with the figures, the case of a molded electronic device comprising several electronic connection tracks 21 will be described in the present description.

The molded electronic device 1 further comprises a connector support 30 molded onto the film and on the electrical connection tracks 21 to form walls 30a adapted to hold the connector above the connection pads 22 and between said walls.

The film 10 is for example of the flexible type. "Flexible" is understood to mean that the film 10 is made of a material and/or with dimensions (for example a thickness) such that the film 10 is able to deform under its own weight when said film 10 is placed on two separated supports. In particular, the Young's modulus of the film 10 may be between 2000 MPa and 3500 MPa.

The film 10 is for example made of a polymeric material. The film 10 may for example be made of polycarbonate (PC), or of polymethyl methacrylate (PMMA). The film 10 for example has a thickness of between 175 microns and 750 microns.

The connector support 30 surrounds the connection pads 22. The connector support 30 is therefore overmolded onto the connection tracks 21.

The connector support 30 is for example made of a polymeric material. The connector support 30 may for example be made of polycarbonate (PC), acrylonitrile butadiene styrene (ABS), or polycarbonate/acrylonitrile butadiene styrene copolymer (PC/ABS), or polymethyl methacrylate (PMMA). The material of the connector support 30 may comprise a filler, such as glass fibers.

The connector support 30 has for example a height H greater than 5 mm. The height H is defined as being the maximum distance in a direction perpendicular to the mean plane of the film 10 (that is to say perpendicular to the directions D1 and D2, defined later with respect to FIG. 2), between the interior face 12 of the film 10 and a point of the interior face 31 of said connector support 30.

The connector support 30 has walls 30a of a sufficient height which surround the connector 40 in order to be able to hold the connector 40 in said connector support 30. The connector support is for example formed at least in part of the support material 39.

The connector 40 is an elastic connector. For example, this connector 40 is elastic in a direction substantially perpendicular to the film 10 of the electronic device 1. Thus, it can be held by pressure between the electronic device 1 and the electronic control circuit 50, by various pressure means, and for example by screws or clips suitable for fastening the electronic control circuit 50 to the molded electronic device 1, or vice versa.

For example, the connector 40 comprises a rigid connection element mounted on an elastic element, such as a spring or an elastomer element.

For example, the connector 40 is an elastomer connector comprising alternating insulating layers and conductive layers, these conductive layers being called in the present disclosure, conductive elements 41 (for example a series of conductive elements 41a, 41b, 41c, etc.). Connectors of this type are known and are sometimes marketed under the brand Zebra®. These connectors have the advantage of adapting to the shape of the support and of being economical, but they can cause electrical connection defects if they are not properly maintained. Because these connectors must be removable, there is no adhesion between the connection pads 22 and the connector 40. Thus additional parts are generally mounted by screwing onto a support in order to accept such a connector, these additional parts being adapted to hold the connector laterally in a direction to a mean film plane 10 and to hold the connector by pressure in the direction substantially perpendicular to this mean film plane 10. The molded device 1 according to the present disclosure does not need such an additional holding part due to the connector support 30 overmolded directly on the electrical connection tracks and on the flexible film. Thus, thanks to this connector support 30, this type of elastic connector can be used on a flexible electrical circuit film.

The connector 40 has for example a Young's modulus between 0.1 MPa and 100 MPa.

In addition, the connector 40 is a part separate from the molded electronic device 1 and the electronic control circuit 50, so that the mounting and the electrical connection between the film 10 and the printed circuit board 51 are facilitated, and tolerant to dimensional variations and relative positions of the elements.

Figure 2:
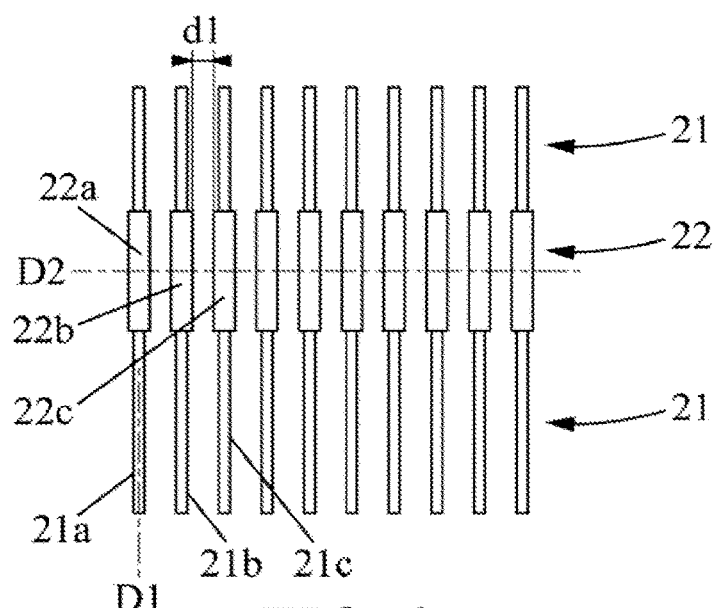
FIG. 2 is a top view of tracks and electrical connection pads.

FIG. 2 illustrates a top view of the connection tracks 21 (for example a series 21a, 21b, 21c) and connection pads 22 (for example a series 22a, 22b, 22c, etc.) produced on the film 10 of the molded electronic device 1. The distance between two neighboring connection pads 22a, 22b is indicated by the sign d1. Neighboring connection pads are understood to mean two adjacent connection pads aligned in a transverse direction D2 perpendicular to the longitudinal direction D1 of the connection tracks 21. Neighboring connection pads may optionally be offset relative to each other in the longitudinal direction D1

In various embodiments of the present disclosure, the connector support 30 is produced such that the connection tracks are not altered by the overmolding of the material of the connector support 30

In particular, the connector support 30 comprises, looking in a direction perpendicular to a mean plane of the film 10, that is perpendicular to the directions D1 and D2:

The first portions 30-1 of the connector support 30 are in direct contact with the connection tracks 21, or in contact with the connection tracks 21 via an adhesion layer.

Such an adhesion layer is not installed on the connection pads 22 intended for electrical contact with the connector 40.

Figure 3:
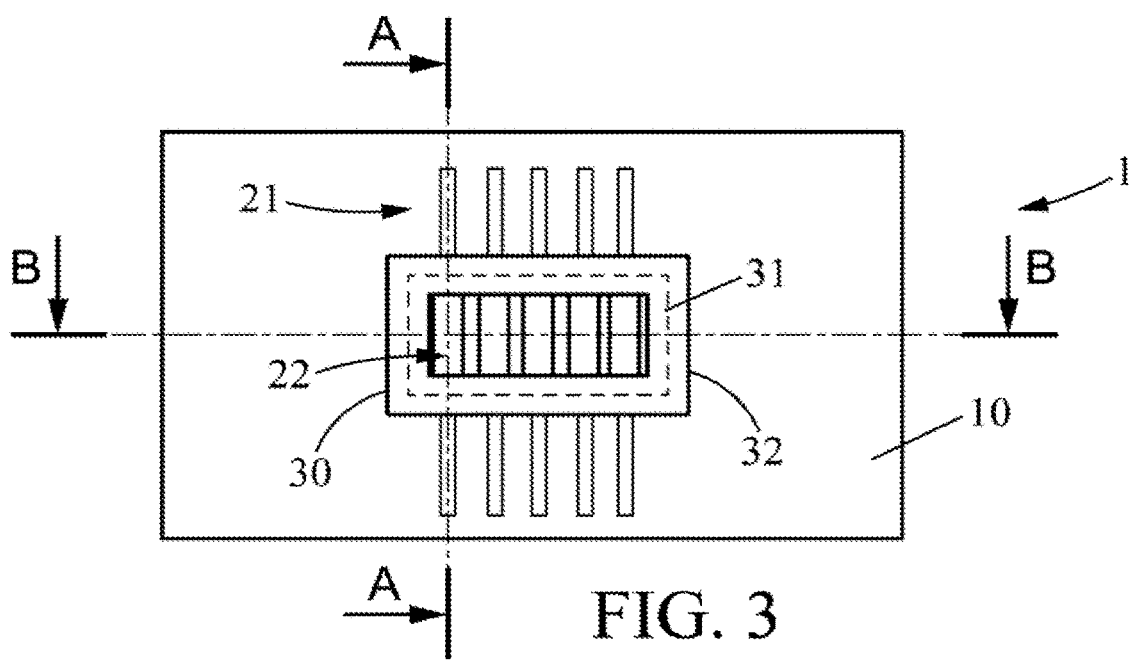
FIG. 3 is a top view of a first embodiment of a molded electrical device.
Figure 6:
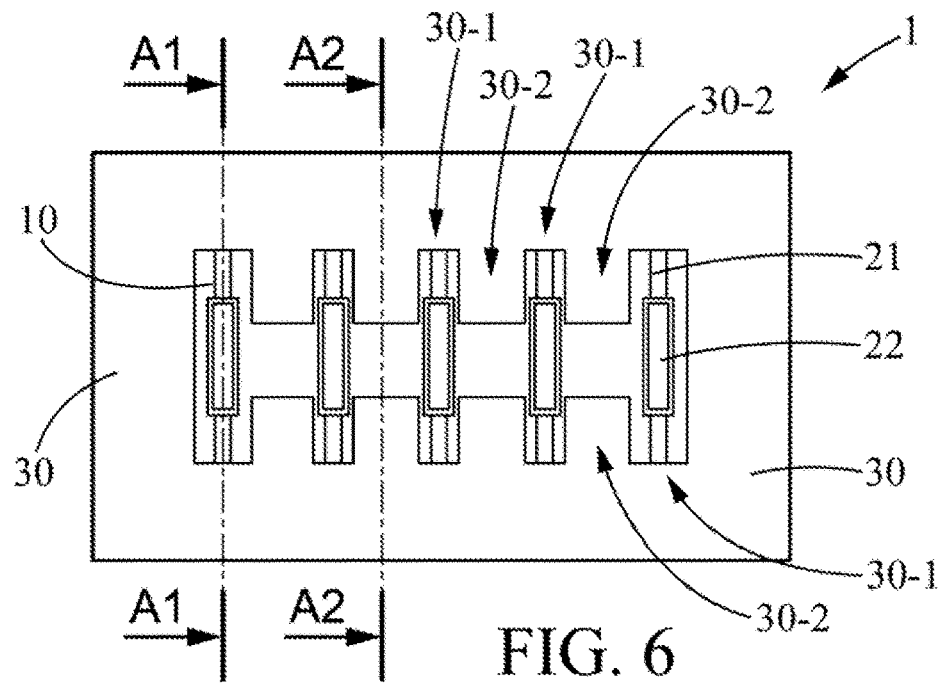
FIG. 6 is a top view of a second embodiment of a molded electrical device.

As the connector support 30 surrounds the connection pads 22, alternatively the connection support 30 has, on its periphery around the connection pads 22, first portions 30-1 and second portions 30-2, as can be seen in FIG. 3 and FIG. 6.

According to a variant of the present disclosure, the first molded portions 30-1 above and superimposed on the electrical connection tracks 21 have a thickness, called the first thickness, of between 0.5 mm and 2.5 mm As a variant, the connector support 30 can be produced by a successive superposition of several layers. A first layer of the connector support 30 or more precisely a first layer of the first portions 30-1 of the connector support 30 has a first thickness of between 0.5 mm and 2.5 mm. First layer is understood to mean a layer of the connector support 30 produced as close as possible to the film 10 and/or connection tracks 21. Thus, this first thickness relates to the first portions 30-1 or a first layer of said first portions of the connector support 30.

Thus, the thickness of material above the electrical connection tracks 21 is limited, and these first portions 30-1 located above the electrical connection tracks 21 do not deteriorate the electrical connection tracks 21 during their production by molding, since the mold removal during cooling is then also limited. The deformations and/or breaks of electrical connection tracks are prevented.

As a variant, the first thickness is less than 1.5 mm. Thus, the thickness of material located above the electrical connection tracks 21 does not damage them.

According to a variant of the present disclosure, first portions 30-1 or a first layer made of said first portions have a first thickness decreasing moving away from the connection pads 22 in the longitudinal direction D1, that is, moving away from the inside of the connection support 30, which accommodates the connector 40.

Thus, the thickness of material above the connection tracks is limited. The deformations and/or breakage of the electrical connection tracks are prevented by the removal of the molding from these first portions 30-1 of the connection support 30, while forming at least a first part 30a1 of the walls 30a. Molding does not damage the connection tracks 21.

In addition, the thickness at the first part 30a1 of the walls 30a may be less than the first thickness. In other words, a reduction in thickness can be formed in line with the first part 30a1 of the walls 30a, as can be seen in FIG. 4A.

According to a first embodiment of the present disclosure shown in FIG. 3, FIG. 4A, FIG. 4B, FIG. 5A, and FIG. 5B, the molded electronic device 1, and in particular the connector support 30, is produced by the successive superposition of several layers on the film 10 and its electrical connection tracks 21. Each layer is molded onto the preceding one and solidified before the next. A succession of mold shapes is provided for the successive injections of these layers. For simplicity, the present disclosure will explain producing two layers, but more than two layers can easily be envisaged FIG. 3 is a top view of the molded electronic device 1 of this first embodiment, wherein the connector support 30 comprises two molded layers. A first layer 31 of the connector support 30 is molded onto the film 1 and the electrical connection tracks 21. This first layer 31 is superimposed on the electrical connection tracks 21 around the connection pads 22. Advantageously, the first layer 31 may surround the connection pads 22. The second layer 32 surrounds the connection pads 22 while being superimposed on the first layer 31.

Figure 4A:
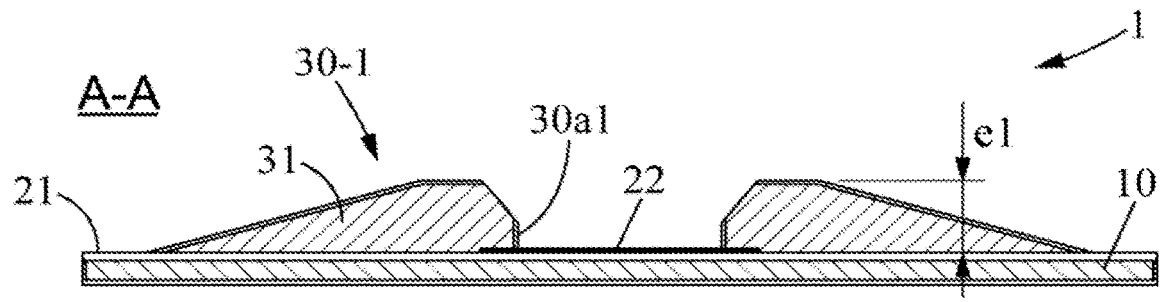
FIG. 4A and FIG. 4B are sectional views along the direction A-A of the device of FIG. 3, FIG. 4A being a view in a first step of manufacturing the device, and FIG. 4B being a view in a second step of manufacturing the device with an additional layer.
Figure 4B:
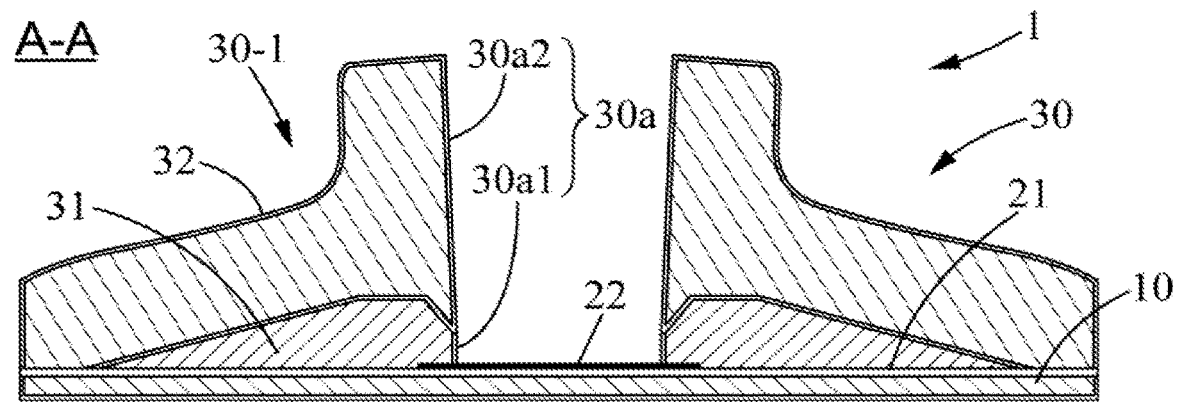

FIG. 4A and FIG. 4B are sectional views of the device of FIG. 3 along the section A-A of FIG. 3, that is, in the longitudinal direction D1 and passing through a connection track 21

FIG. 4A shows the production of the first layer 31 of the connector support 30 in the view of section A-A of FIG. 3. The first layer 31 is injection molded onto the electrical connection tracks 21, and optionally onto the film 10. This first layer 31 has a thickness, called first thickness e1, of between 0.5 mm and 2.5 mm. Typically, this first thickness is less than 1.5 mm. Thus, this first layer 31 forms a first part 30a1 of the wall 30a of the connector support 30. This first part 30a1 of the wall 30a rises substantially perpendicular to the film 10 and faces the connection pads 22

By virtue of this first layer 31 of small thickness formed before a second layer 32, the electrical connection tracks 21 located under this first layer 31 undergo little or no deformation and are not damaged by this overmolding, and particularly the problem of mold removal, which is low in the case of this first layer 31.

According to one variant, this first layer 31 has a first thickness e1 which decreases moving away from the connection pads 22. The electrical connection tracks 21 are properly held at the wall 30a and well protected from mold removal. This therefore avoids any degradation of the electrical connection tracks 21. The electrical connection tracks 21 are not deformed or damaged by this first layer 31 of small thickness of between 0.5 mm and 2.5 mm, and preferably less than 1.5 mm.

FIG. 4B shows the production of the second layer 32 of the connector support 30 in the view of section A-A of FIG. 3, said second layer 32 being injection molded onto the first layer 31. The second layer 32 makes it possible to form a second part 30a2 of the wall 30a of the connector support 30. This second layer 32 can extend upward substantially perpendicular to the film 10 to a height high enough to hold the connector 40. The total height of the walls 30a of the connector support 30 is for example between 2 mm and 30 mm.

According to one variant, the first layer 31 is produced with a first material, and the second layer 32 is produced with a second material. Optionally, the first and second materials are different. The first part 30a1 and the second part 30a2 of the wall 30a are for example aligned vertically. In other words, the second part 30a2 is in the extension of the first part 30a1, as can be seen in FIG. 4B.

Figure 5A:
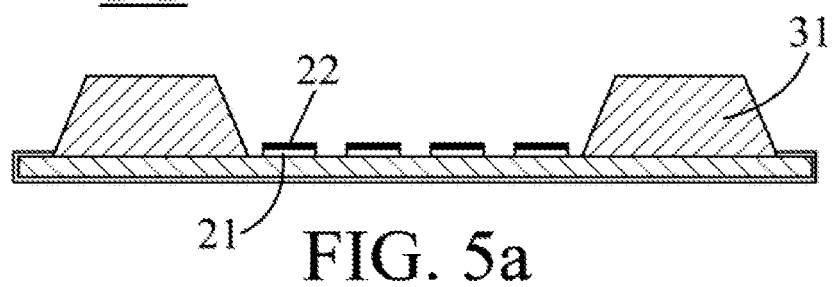
FIG. 5A and FIG. 5B are sectional views along the direction B-B of the device of FIG. 3, FIG. 5A being a view in the first step of manufacturing the device, and FIG. 5B being a view in the second step of manufacturing the device with an additional layer.
Figure 5B:
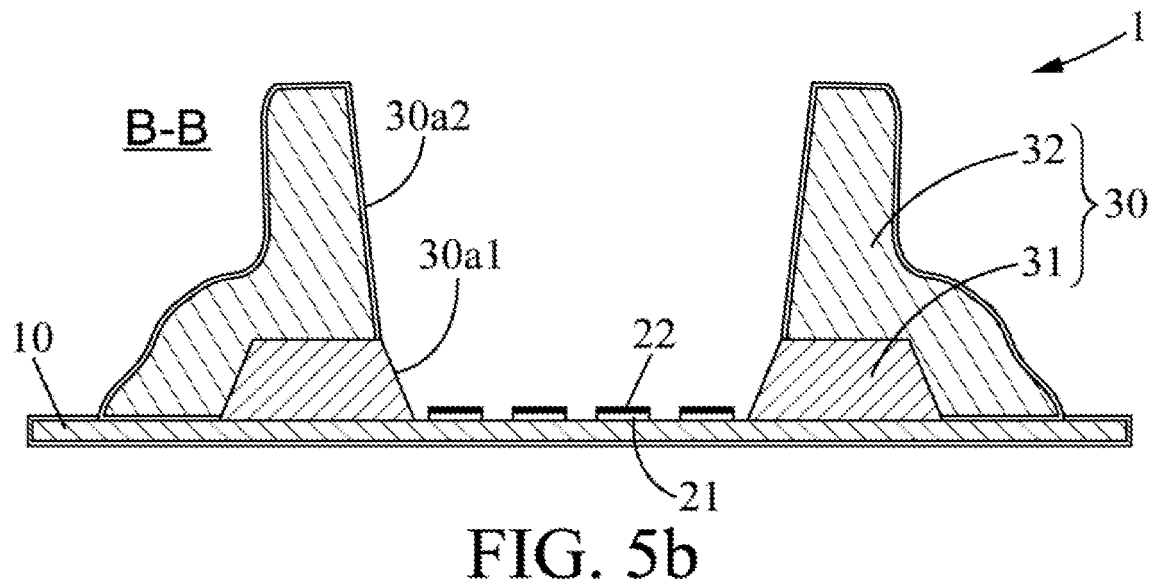

However, the first part 30a1 and the second part 30a2 of the wall 30a are not necessarily aligned vertically, as can be seen in FIG. 5B which shows the elevation in the direction D2. Indeed, the connector 40 especially requires mechanical retention in the longitudinal direction D1, which corresponds to the smallest dimension of said connector 40.

FIG. 5A and FIG. 5B are sectional views of the device of FIG. 3 along the section B-B of FIG. 3, that is, in the direction D2, perpendicular to the direction D1 of a connection track 21.

FIG. 5A illustrates the production of the first layer 31 in the view of section B-B of FIG. 3. FIG. 5B shows the production of the second layer 32 of the connector support 30 in the view of section B-B of FIG. 3, said second layer 32 being injection molded onto the first layer 31. These figures show the electrical connection tracks 21 cut transversely (in the direction D2) and therefore the elevation of the first part 30a1 and the second part 30a2 of the wall 30a in this direction.

Figure 7A:
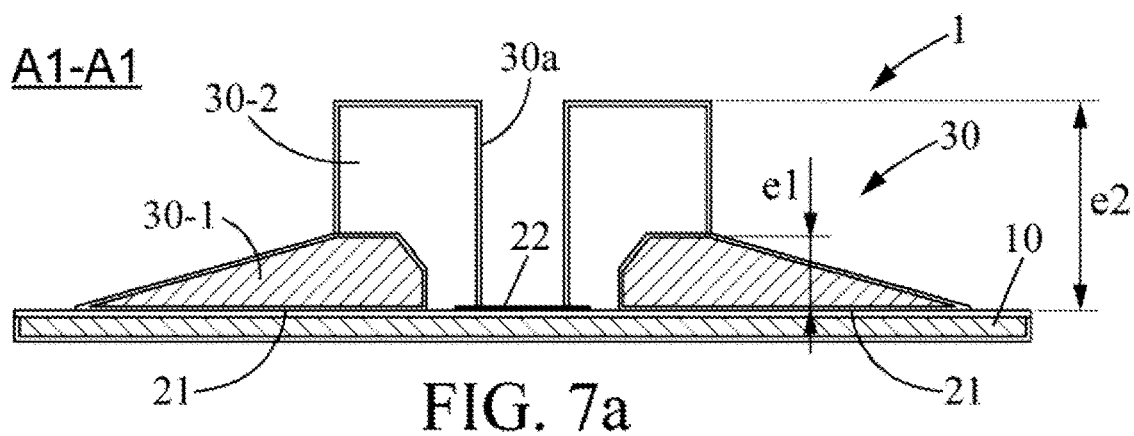
FIG. 7A is a sectional view along the direction A1-A1 of the device of FIG. 6.
Figure 7B:
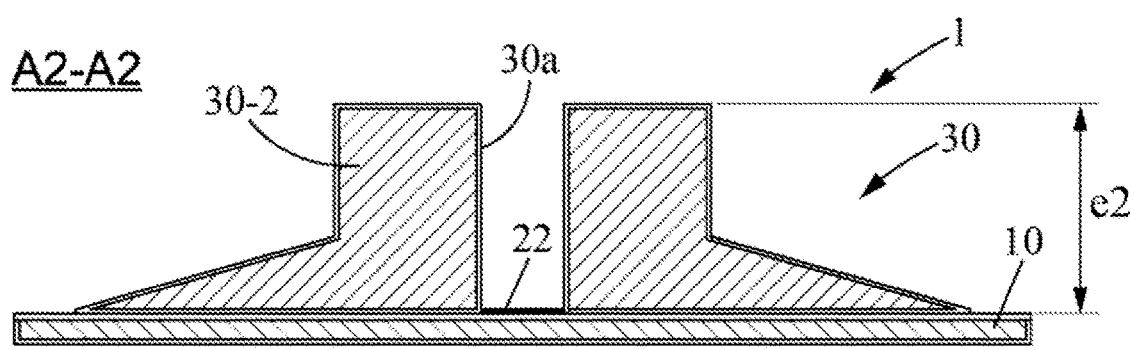
FIG. 7B is a sectional view along the direction A2-A2 of the device of FIG. 6.

According to a second embodiment of the present disclosure shown in FIG. 6, FIG. 7A, and FIG. 7B, the connector support 30 is produced by a single layer on the film 10 and its electrical connection tracks 21.

FIG. 6 is a top view of the molded electronic device 1 of this second embodiment, wherein the connector support 30 has different thicknesses. In particular, the connector support 30 has a first thickness e1 in areas (first portions) located above the electrical connection tracks 21, and a second thickness e2, larger than the first thickness, in areas (second portions) without an electrical connection track.

FIG. 7A shows the production of the connector support 30 in the view of section A1-A1 of FIG. 6, and FIG. 7B shows the embodiment of the connector support 30 in the view of section A2-A2 of FIG. 6. These sectional views make it possible to view the elevations, and therefore the thicknesses in the various first portions 30-1 and second portions 30-2 of the connector support 30. In FIG. 7B, the connection pad 22 is not in the sectional plane but is seen in the background.

Thus, the connector support 30 comprises:
first portions 30-1 located above the electrical connection tracks 21, said first portions 30-1 having a first thickness e1,
second portions 30-2 not located above the electrical connection tracks 21, or in other words located on the film 10 away from the electrical connection tracks in the direction D2, said second portions 30-2 having a second thickness e2.

The second thickness e2 is greater than the first thickness e1. Advantageously, the second thickness e2 is for example at least twice that of the first thickness e1. Thus, the thickness of the connection support 30 is reduced above the connection tracks, and damage to the connection tracks 21 is prevented while maintaining good retention of the connector 40 by the connector support 30 thanks to the second thicker portions.

Furthermore, according to a variant, the walls of the first portions 30-1 are further away from the connection pads 22 than the walls of the second portions 30-2 along the direction D1, as can be seen in FIG. 7A. Thus, deterioration of the connection tracks 21 by the overmolding of the connector support 30 is even less likely, while improving the retention by the second portions, closer to the connection pads 22. In such a case, in the top view of FIG. 6, the connector support 30 has a generally crenellated shape which surrounds the connection pads 22. The connector 40 is then held by the overhangs of the second portions 30-2 (also of a greater thickness), and this flexible connector 40 is well held in the connection support 30, above the connection pads 22 to produce a reliable electrical contact.

Finally, such an arrangement with the overhangs of the connector support 30 between the electrical connection tracks can also be used in the first embodiment with the molding of two layers of connector support material The manufacturing method of the molded electronic device 1 and its connector support 30 transpires from the description of the above product and in particular by the injection molding manufacturing steps shown in FIG. 4A, FIG. 4B, FIG. 5A, and FIG. 5B for the first embodiment, and by injection molding shown in FIG. 7A and FIG. 7B for the second embodiment.

Thus, the method for manufacturing a molded electronic device 1 comprises the steps of:
- providing a film,
- forming electrical connection tracks 21 arranged on the film 10, the electrical connection tracks 21 comprising connection pads 22 configured to be connected to conductive elements of a connector 40, the electrical connection tracks extending partially along a longitudinal direction D1, and said connector being an elastic connector, and
- forming a connector support 30 by molding onto the film and on the electrical connection tracks 21 to form walls 30a adapted to hold the connector above the connection pads 22 and between said walls.

The connector support 30 for example has first portions 30-1 located above the electrical connection tracks 21, said first portions 30-1 or a first layer 31 of the first portions having a first thickness e1 of between 0.5 mm and 2.5 mm.

The connector support 30 is for example produced by:
- forming a first layer 31 by molding onto the electrical connection tracks 21, said first layer 31 having a first thickness e1 of between 0.5 mm and 2.5 mm, and said first layer 31 forming a first part 30a1 of the walls 30a, and
- forming a second layer 32 by molding onto the first layer 31 and forming a second part 30a2 of the walls 30a, said second layer 32 being formed on the first layer 31 after cooling of the first layer 31.

Finally, the molding(s) are injection moldings.

The invention claimed is:

1. A molded electronic device comprising:
   a film, and
   electrical connection tracks arranged on the film, the electrical connection tracks comprising connection pads configured to be connected to conductive elements of a connector, the electrical connection tracks extending in part along a longitudinal direction, and said connector being an elastic connector, and
   wherein said molded electronic device further comprises a connector support molded onto the film and onto the electrical connection tracks in order to form walls adapted to hold the connector above the connection pads and between said walls.

2. The device according to claim 1, wherein the connector support has first portions located above the electrical connection tracks, said first portions or a first layer of the first portions having a first thickness between 0.5 mm and 2.5 mm.

3. The device according to claim 2, wherein the first thickness is less than 1.5 mm.

4. The device according to claim 1, wherein the connector support comprises first portions located above the electrical connection tracks, said first portions or a first layer of the first portions having a first thickness decreasing moving in the longitudinal direction from the connection pads.

5. The device according to claim 1, wherein the walls of the connector support surround the connection pads.

6. The device according to claim 1, wherein the connector support is formed by:
   a first layer molded onto the electrical connection tracks, said first layer having a first thickness between 0.5 mm and 2.5 mm, and said first layer forming a first part of the walls, and
   a second layer molded onto the first layer and forming a second part of the walls.

7. The device according to claim 6, wherein the second part of the walls is in line with the first part of the walls, for at least the walls substantially perpendicular to the longitudinal direction.

8. The device according to claim 1, wherein the connector support comprises:
   first portions located above the electrical connection tracks, said first portions having a first thickness, and
   second portions not located above the electrical connection tracks, said second portions having a second thickness,
   wherein the second thickness is at least two times greater than the first thickness.

9. A method for manufacturing a molded electronic device comprising the steps of:
   providing a film,
   forming electrical connection tracks arranged on the film, the electrical connection tracks comprising connection pads configured to be connected to conductive elements of a connector, the electrical connection tracks extending partially along a longitudinal direction D1, and said connector being an elastic connector, and
   forming a connector support by molding onto the film and on the electrical connection tracks to form walls adapted to hold the connector above the connection pads and between said walls.

10. The method according to claim 9, wherein the connector support has first portions located above the electrical connection tracks, said first portions or a first layer of the first portions having a first thickness between 0.5 mm and 2.5 mm.

11. The method according to claim 10, wherein the connector support is produced by:
   forming a first layer by molding onto the electrical connection tracks, said first layer having a first thickness of between 0.5 mm and 2.5 mm, and said first layer forming a first part of the walls, and
   forming a second layer by molding onto the first layer and forming a second part of the walls, said second layer being formed on the first layer after cooling of the first layer.

12. The method according to claim 9, wherein the molding(s) are injection moldings.

* * * * *